(12) United States Patent
Yamamoto

(10) Patent No.: US 10,770,003 B2
(45) Date of Patent: Sep. 8, 2020

(54) TRANSFER CIRCUIT, SHIFT REGISTER, GATE DRIVER, DISPLAY PANEL, AND FLEXIBLE SUBSTRATE

(71) Applicant: JOLED INC., Tokyo (JP)

(72) Inventor: Tetsuro Yamamoto, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/233,892

(22) Filed: Dec. 27, 2018

(65) Prior Publication Data

US 2019/0221164 A1 Jul. 18, 2019

(30) Foreign Application Priority Data

Jan. 16, 2018 (JP) ................................. 2018-004951

(51) Int. Cl.
| | |
|---|---|
| *G09G 3/3266* | (2016.01) |
| *G11C 19/28* | (2006.01) |
| *G09G 3/3225* | (2016.01) |
| *G09G 3/20* | (2006.01) |
| *H01L 27/12* | (2006.01) |

(52) U.S. Cl.
CPC ............ *G09G 3/3266* (2013.01); *G09G 3/20* (2013.01); *G09G 3/3225* (2013.01); *G11C 19/28* (2013.01); *G09G 2310/0267* (2013.01); *G09G 2310/0286* (2013.01); *G09G 2310/0291* (2013.01); *G09G 2310/08* (2013.01); *G09G 2380/02* (2013.01); *H01L 27/1225* (2013.01)

(58) Field of Classification Search
CPC ...... G09G 3/3266; G09G 3/20; G09G 3/3225; G09G 3/3677; G09G 2310/0267; G09G 2310/0286; G09G 2310/0291; G09G 2310/0202; G09G 2310/08; G09G 2380/02; G11C 19/28; H01L 27/1225
See application file for complete search history.

(56) References Cited

U.S. PATENT DOCUMENTS

| | | | | |
|---|---|---|---|---|
| 5,412,334 A | * | 5/1995 | Katsura | .................. G11C 19/28 327/291 |
| 10,431,159 B2 | * | 10/2019 | Fujimura | ............. G09G 3/3266 |
| 2006/0061385 A1 | * | 3/2006 | Jinta | ..................... G09G 3/3677 326/81 |

(Continued)

FOREIGN PATENT DOCUMENTS

JP 2017-045499 3/2017

*Primary Examiner* — Tom V Sheng
(74) *Attorney, Agent, or Firm* — Greenblum & Bernstein, P.L.C.

(57) ABSTRACT

A transfer circuit includes an input circuit, a reset circuit, an output circuit, and an output stabilizer circuit, and obtains an input signal at an input terminal, holds the input signal, and outputs the input signal from an output terminal as an output signal in synchronization with a clock signal. The transfer circuit includes an inverter circuit that has an input terminal connected to at least one of the input and output terminals of the transfer circuit, and outputs, from an output terminal, an inverted signal having an inverted polarity of at least one of the input and output signals. The reset circuit includes a first transistor having a control signal end connected to the output terminal of the inverter circuit, the first transistor switching continuity and discontinuity of a signal path between one end of a first capacitor that holds the input signal and a first power supply.

20 Claims, 24 Drawing Sheets

(56) References Cited

U.S. PATENT DOCUMENTS

| | | | |
|---|---|---|---|
| 2006/0171501 A1* | 8/2006 | Lim | G11C 19/00 377/64 |
| 2008/0198961 A1* | 8/2008 | Collins | G09G 3/3688 377/70 |
| 2011/0142191 A1* | 6/2011 | Tobita | G11C 19/184 377/64 |
| 2013/0194033 A1* | 8/2013 | Murakami | H04L 25/0272 327/543 |
| 2017/0004760 A1* | 1/2017 | Jang | G09G 3/2092 |
| 2017/0061879 A1* | 3/2017 | Fujimura | G09G 3/3266 |
| 2019/0213945 A1* | 7/2019 | Yamamoto | G11C 19/28 |

\* cited by examiner

TRANSFER CIRCUIT, SHIFT REGISTER, GATE DRIVER, DISPLAY PANEL, AND FLEXIBLE SUBSTRATE

CROSS REFERENCE TO RELATED APPLICATION

The present application is based on and claims priority of Japanese Patent Application No. 2018-004951 filed on Jan. 16, 2018. The entire disclosure of the above-identified application, including the specification, drawings and claims is incorporated herein by reference in its entirety.

FIELD

The present disclosure relates to a transfer circuit, a shift register, a gate driver, a display panel, and a flexible substrate.

BACKGROUND

Conventionally, display devices having a plurality of pixel circuits arranged in a matrix have been widely put into practical use. Such display devices display an image by driving the plurality of pixel circuits row by row, using a control signal applied at different timing for each row. The control signal applied row by row is generated using, for example, a shift register. Japanese Unexamined Patent Application Publication No. 2017-45499 (Patent Literature (PTL) 1) discloses a register circuit which can be used as a transfer circuit at each stage of such a shift register.

CITATION LIST

Patent Literature

[PTL 1] Japanese Unexamined Patent Application Publication No. 2017-45499

SUMMARY

Technical Problem

With the register circuit disclosed in Japanese Unexamined Patent Application Publication No. 2017-45499, the potential of an output signal slightly rises in some cases although it is supposed to be at the low level. Even with a simple, two-phase drive transfer circuit that the inventor has considered as a comparative example, an undesired potential rise occurs in the output signal (the details will be described later). There is thus apprehension that, with the shift register formed by connecting a plurality of such register circuits or transfer circuits, repeated transfer of the control signal could lead to accumulation of rise in the potential and could thereby result in malfunction.

In view of this, the present disclosure has an object to provide a transfer circuit that does not easily cause an undesired rise in the potential of the output signal, and also provide a shift register, a gate driver, a display panel, and a flexible substrate using such a transfer circuit.

Solution to Problem

In order to achieve the above object, a transfer circuit according to an aspect of the present disclosure is a transfer circuit that includes an input circuit, a reset circuit, an output circuit, and an output stabilizer circuit, and obtains an input signal at an input terminal, holds the input signal, and outputs the input signal from an output terminal as an output signal in synchronization with a clock signal, the transfer circuit including: an inverter circuit that has an input terminal connected to at least one of the input terminal and the output terminal of the transfer circuit, and outputs an inverted signal from an output terminal, the inverted signal having an inverted polarity of at least one of the input signal and the output signal, wherein the reset circuit includes a first transistor having a control signal end connected to the output terminal of the inverter circuit, the first transistor switching continuity and discontinuity of a signal path between one end of a first capacitor that holds the input signal and a first power supply.

Advantageous Effects

According to such a configuration, even when the output signal is output using a so-called depletion-type transistor having a negative threshold voltage, a transistor T1 can be placed in the OFF state according to voltage setting. Additionally, it is possible to inhibit a significant rise in the potential of an output terminal OUT caused by a circuit operation.

This enables reduction in occurrence of erroneous transfer in a shift register including a plurality of transfer circuits connected in series.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT (Underlying Knowledge Forming the Basis of the Present Disclosure)

Prior to describing some embodiments of the present disclosure, the following describes the configuration of a register circuit according to a conventional example and the risk of malfunction discovered by the inventor.

Figure 1:
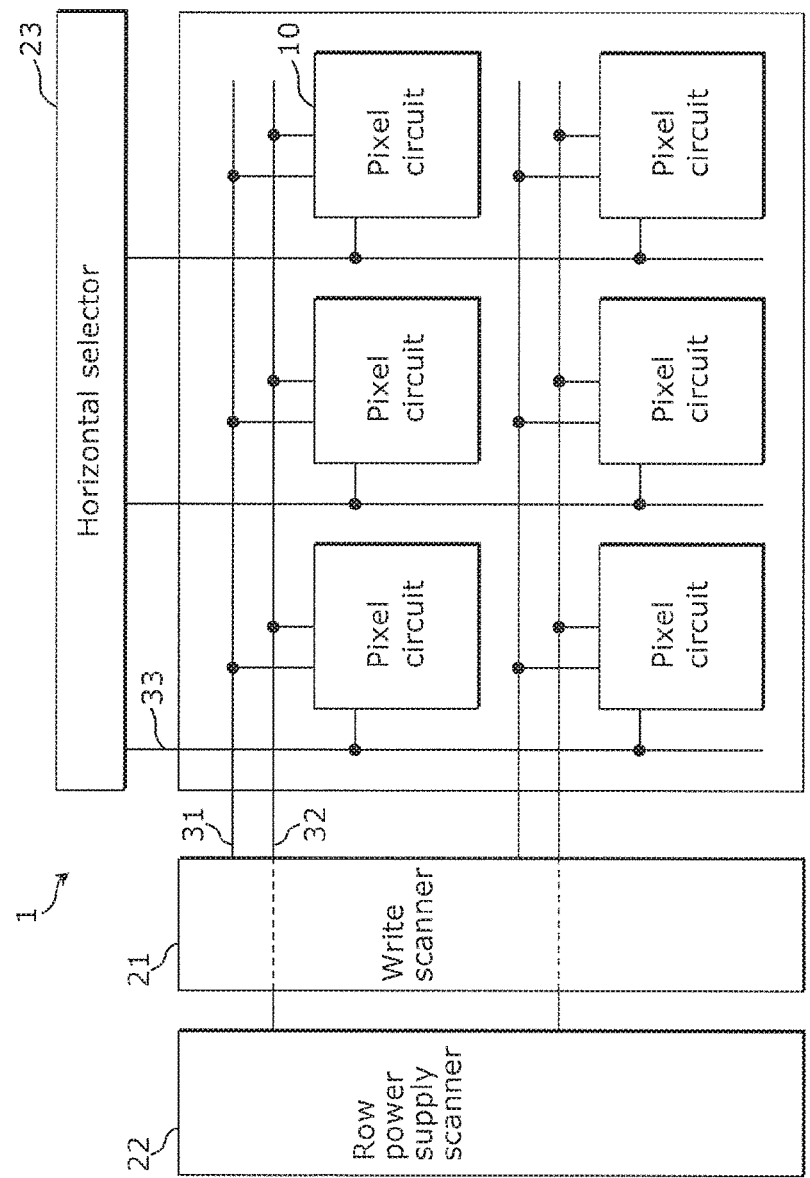
FIG. 1 is a functional block diagram illustrating an example of a configuration of the main part of a common display device.

FIG. 1 is a functional block diagram illustrating an example of a configuration of the main part of a common display device. As illustrated in FIG. 1, the main part of a display device 1 includes a plurality of pixel circuits 10, a write scanner 21, a row power supply scanner 22, a horizontal selector 23, scan signal lines 31 and 32, and data signal lines 33.

The plurality of pixel circuits 10 are arranged in a matrix. Each row of the matrix is provided with the scan signal lines 31 and 32 connected to a plurality of pixel circuits 10 disposed in the same row, and each column of the matrix is provided with a data signal line 33 connected to a plurality of pixel circuits 10 disposed in the same column.

The write scanner 21 and the row power supply scanner 22 supply, via the scan signal lines 31 and 32, the pixel circuits 10 with a write signal and a row power supply, respectively, for controlling the operations of the pixel circuits 10 at timing unique to each row.

The horizontal selector 23 supplies the pixel circuits 10 with a data signal corresponding to luminance via the data signal lines 33.

Figure 2:
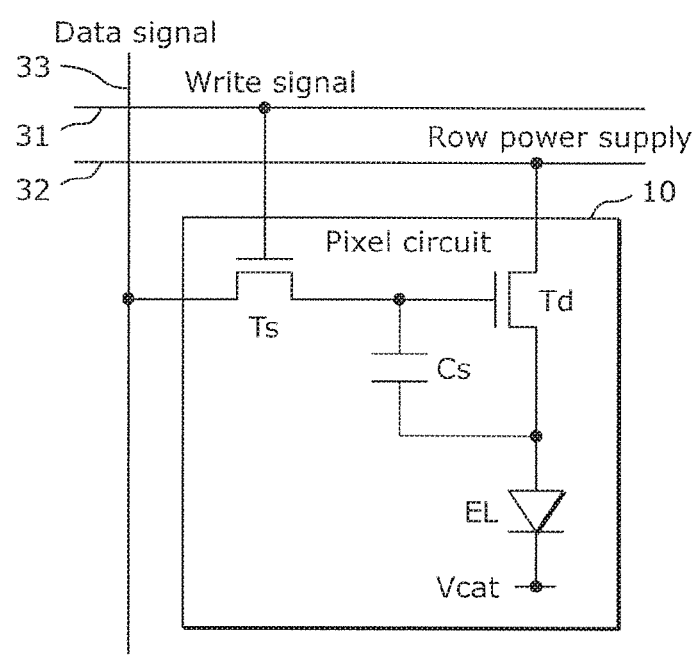
FIG. 2 is a circuit diagram illustrating an example of a configuration of a simplified pixel circuit.

FIG. 2 is a circuit diagram illustrating an example of a configuration of a simplified pixel circuit, and shows an example of a pixel circuit included in an active-matrix organic electroluminescent (EL) display device.

Since organic EL elements are current-driven light-emitting elements, the color gradation is provided by controlling the amount of current flowing through the organic EL elements. In the pixel circuit illustrated in FIG. 2, a driving transistor Td supplies the EL element with an amount of current in accordance with a data voltage held by a holding capacitor Cs via a switching transistor Ts.

Figure 3:
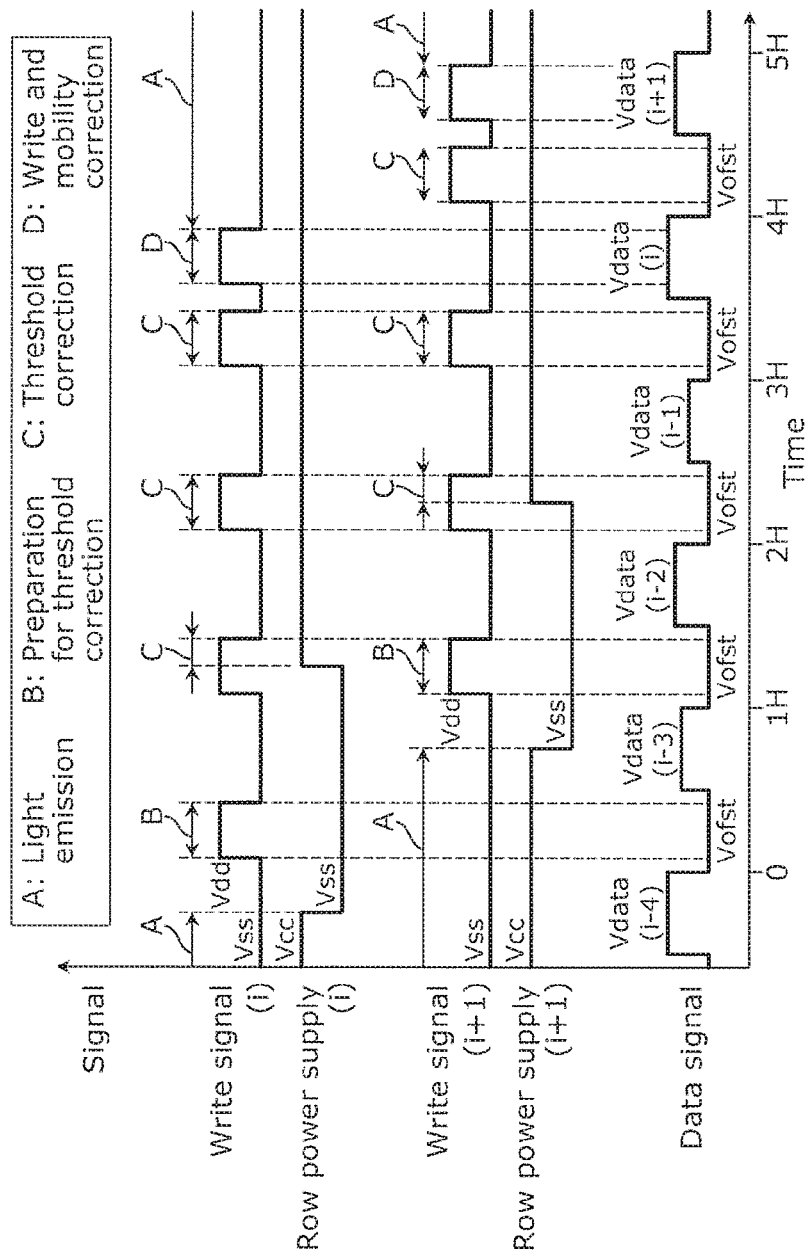
FIG. 3 is a timing chart illustrating an example of operations of a display device.

FIG. 3 is a timing chart illustrating an example of operations of the display device 1, and shows an example of time waveforms of the write signal, the row power supply, and the data signal supplied to the pixel circuits 10 located in two adjacent rows. The parenthesized numbers given at the end of the reference signs in FIG. 3 denote corresponding row numbers.

By receiving the write signal and the row power supply having the waveforms illustrated in FIG. 3, the pixel circuits 10 perform, after light emission is finished for a preceding frame, preparation for threshold correction, threshold correction, and write and mobility correction over four horizontal synchronization (H) periods, and start light emission for a subsequent frame. Note that the details of the configuration and operations of the pixel circuits 10 will not be described as the pixel circuits 10 are not the main aspect of the present disclosure and a well-known technology is used as appropriate.

As the write scanner 21 and the row power supply scanner 22 respectively supply the write signal and the row power supply at timing shifted for each row, the pixel circuits 10 perform light emission, preparation for threshold correction, threshold correction, and write and mobility correction at different timing for each row (for example, at timing shifted by one horizontal synchronization period for each row).

The write scanner 21 and the row power supply scanner 22 may be provided in a driver IC, or may be incorporated into the display panel for cost reduction. A gate driver that, like the write scanner 21 and the row power supply scanner 22, outputs a plurality of signals having the same waveform at different timing can be implemented using, for example, a shift register.

Figure 4:
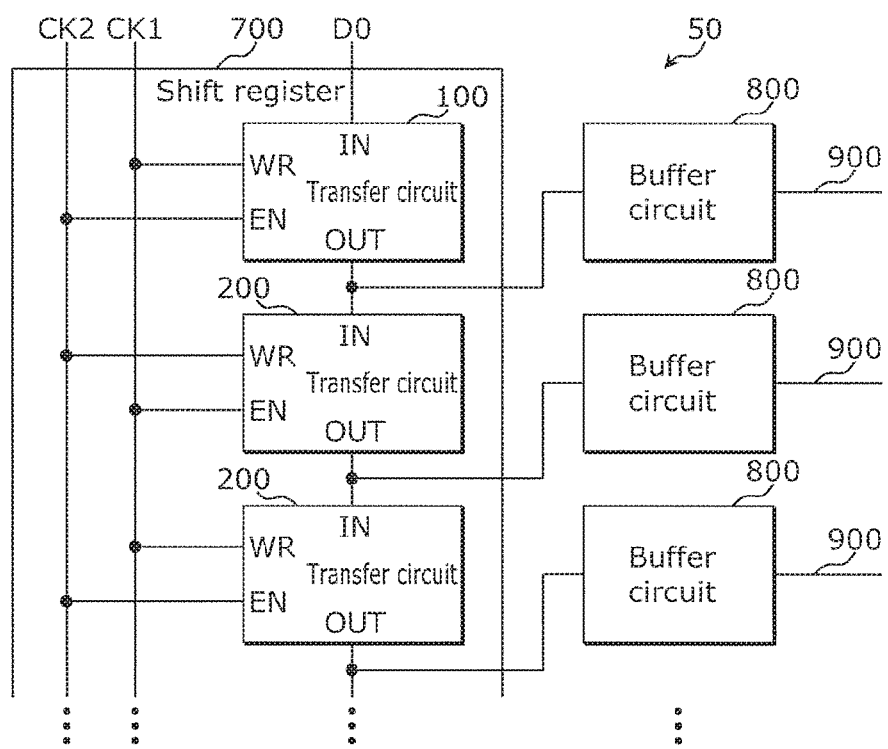
FIG. 4 is a functional block diagram illustrating an example of a schematic configuration of a gate driver.

FIG. 4 is a functional block diagram illustrating an example of a schematic configuration of a gate driver 50, and shows a part of a general-purpose circuit configuration applicable to both the write scanner 21 and the row power supply scanner 22. The gate driver 50 includes: a shift register 700 including a plurality of transfer circuits 100 connected in series; and a plurality of buffer circuits 800 that drive output signal lines 900 according to the output of the transfer circuits 100. The transfer circuits 100, the buffer circuits 800, and the output signal lines 900 are provided corresponding to the rows of the display device 1. The shift register 700 is, for example, a two-phase drive shift register that operates according to two-phase clock signals (including a control signal and a pulse power supply) CK1 and CK2 whose active periods do not overlap each other.

In general, in peripheral drive circuits and pixel circuits, amorphous silicon (aSi)-thin film transistors (TFTs) or oxide TFTs whose processes are simpler than low temperature polysilicon (LTPS)-TFTs are often used for cost reduction. However, unlike the LTPS-TFTs, only the transistors of the N-channel are put into practical use as the aSi-TFTs and the oxide TFTs. Consequently, circuits including the aSi-TFTs and the oxide TFTs tend to be complicated.

In recent years, oxide TFTs have attracted attention due to their properties such as low leakage and high mobility in addition to ease of fabrication. However, due to the reason that the threshold voltage of the oxide TFT is generally negative (depletion type) in addition to the reason that only the transistors of the N-channel are put into practical use as described above, it is necessary to inhibit occurrence of malfunction even when the threshold voltages of the TFTs in peripheral drive circuits are negative.

Figure 5:
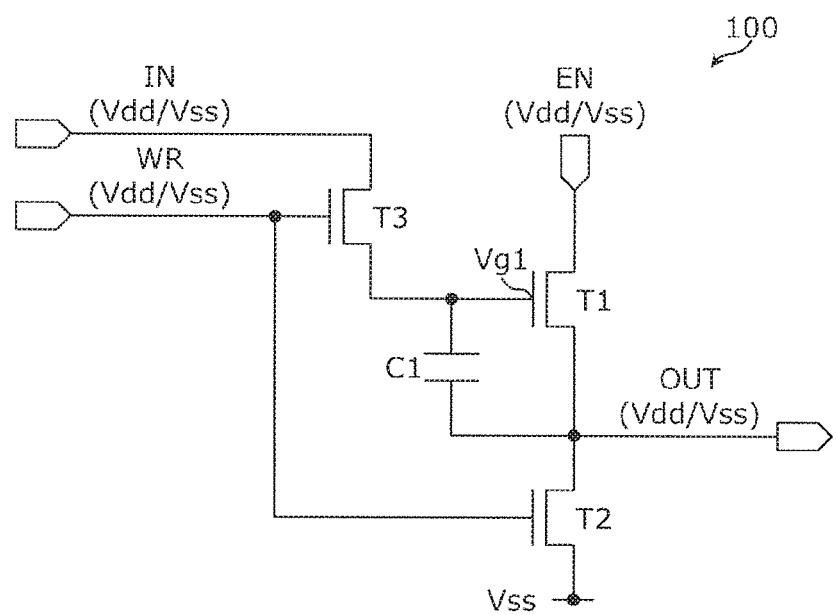
FIG. 5 is a circuit diagram illustrating an example of a configuration of a transfer circuit according to a comparative example.

FIG. 5 is a circuit diagram illustrating an example of the transfer circuit 100 according to a comparative example considered by the inventor, and shows a simplified, two-phase drive register circuit. In FIG. 5, the parenthesized reference signs added to the signal names are power supply potentials representing the typical potentials of the signals at the high level and the low level.

In the following description, for the sake of brevity, a signal and a terminal for inputting and outputting the signal are denoted by the same reference sign, and the potential of a power supply and a power supply line for supplying power having that potential are denoted by the same reference sign.

The transfer circuit 100 obtains an input signal IN, holds the signal in a capacitor C1, and outputs the signal as an output signal OUT in synchronization with a control signal WR and a pulse power supply EN. As illustrated in FIG. 4, transfer circuits 100 in the odd-numbered rows operate according to clock signals CK1 and CK2 as the control signal WR and the pulse power supply EN, respectively, and transfer circuits 100 in the even-numbered rows operate according to the clock signals CK2 and CK1 as the control signal WR and the pulse power supply EN, respectively. The clock signals CK1 and CK2 are two-phase clock signals whose active periods (in which the signal is at the high level) do not overlap each other.

Figure 6:
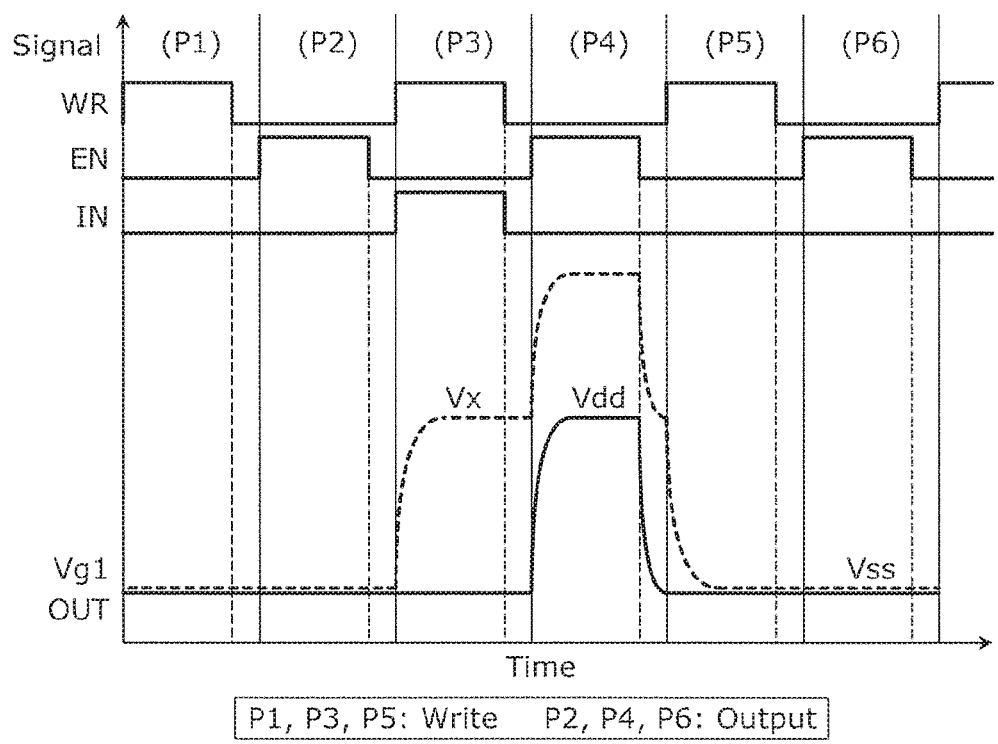
FIG. 6 is a timing chart illustrating an example of operations of the transfer circuit according to the comparative example.

FIG. 6 is a timing chart illustrating an example of basic operations of each transfer circuit 100.

FIG. 7A to FIG. 7D are circuit diagrams each illustrating an example of an operating state of the transfer circuit 100 in the main part of the timing chart in FIG. 6. In FIG. 7A to FIG. 7D, the transistors in the ON state are indicated by solid lines, and the transistors in the OFF state are indicated by dotted lines. Transmission of a potential is indicated by a dashed arrow.

Figure 7A:
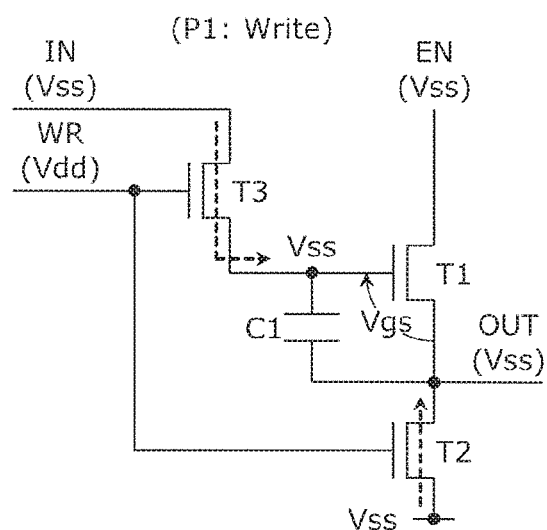
FIG. 7A is a circuit diagram illustrating an example of an operating state of the transfer circuit according to the comparative example.

In a period P1, an input signal IN is Vss (low level), the control signal WR is Vdd (high level), and the output signal OUT is set to a power supply potential Vss (low level) via a transistor T2. The gate potential of the transistor T1 becomes the power supply potential Vss via a transistor T3. At this time, when the gate-source voltage Vgs of the transistor T1 is smaller than a threshold voltage Vt1 of the transistor T1, the transistor T1 is placed in the OFF state. The operation in the period P1 is referred to as write (FIG. 7A).

Figure 7B:
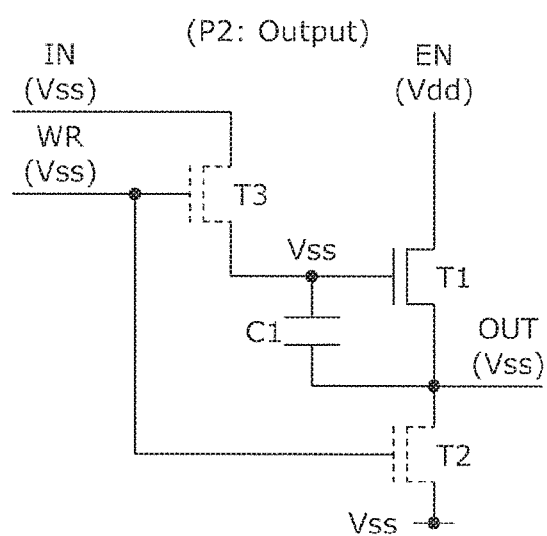
FIG. 7B is a circuit diagram illustrating an example of an operating state of the transfer circuit according to the comparative example.

In a period P2, after the control signal WR becomes the power supply potential Vss (low level), the potential of the pulse power supply EN is changed from Vss to Vdd. At this time, when the gate-source voltage Vgs of the transistor T1 is smaller than or equal to the threshold voltage Vt1 of the transistor T1, the transistor T1 is placed in the OFF state as described above and the potential of the output signal OUT remains at Vss. The potential of the input signal IN is held by the capacitor C1. The operation in the period P2 is referred to as output (FIG. 7B).

The operations of write and output in the periods P1 and P2 correspond to the operation of transfer of the low-level input signal.

Figure 7C:
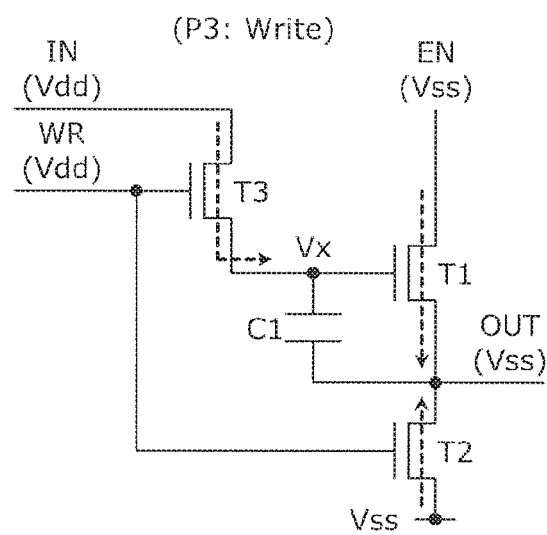
FIG. 7C is a circuit diagram illustrating an example of an operating state of the transfer circuit according to the comparative example.

In a period P3, the write operation is performed again. After the potential of the pulse power supply EN changes from Vdd to Vss, both the input signal IN and the control signal WR change from the low level to the high level. At this time, the transistors T2 and T3 are placed in the ON state, the gate potential of the transistor T1 becomes Vx, and the potential of the output signal OUT becomes Vss. The gate-source voltage Vgs (=Vx−Vss) of the transistor T1 is set to be greater than the threshold voltage Vt1 of the transistor T1 (FIG. 7C).

Figure 7D:
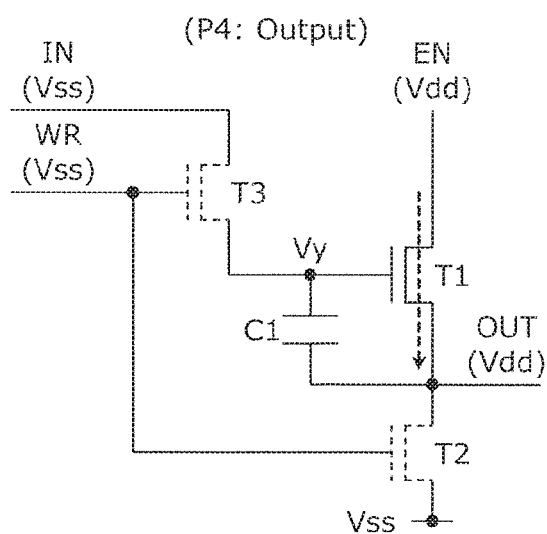
FIG. 7D is a circuit diagram Illustrating an example of an operating state of the transfer circuit according to the comparative example.

In a period P4, the input signal IN and the control signal WR are set to the low level, and the potential of the pulse power supply EN is changed from Vss to Vdd (FIG. 7D). As described above, since the gate-source voltage Vgs of the transistor T1 is set to be greater than the threshold voltage of the transistor T1, a current flows as illustrated in FIG. 7D, the source potential and the gate potential of the transistor T1 rise, and after a lapse of a certain period of time, the potential of the output terminal OUT becomes the power supply potential Vdd (high level), and the potential Vdd of the pulse power supply EN is transferred to the transfer circuit of the next stage. Thereafter, the pulse power supply EN becomes the potential Vss, and the gate potential of the transistor T1 and the potential of the output signal OUT decrease.

The operations of write and output in the periods P3 and P4 correspond to the operation of transfer of the high-level input signal IN.

In the operations of write and output in the subsequent periods P5 and P6, the low-level input signal is transferred again.

However, when the threshold voltage Vt1 of the transistor T1 is negative (depletion type), the gate-source voltage of the transistor T1 becomes greater than the threshold voltage Vt1 of the transistor T1 in the periods P1 and P5 in FIG. 6 during which the low-level input signal IN is written.

Consequently, when the pulse power supply EN changes from the low level to the high level (the period P2 in FIG. 6), the potential of the output signal OUT becomes greater than Vss, which may cause erroneous transfer of the signal to the transfer circuit of the next stage.

In view of this, the present inventor has, as a result of diligent studies, devised a transfer circuit that does not easily cause such erroneous transfer.

Embodiment

The following describes an embodiment of the present disclosure with reference to the drawings.

Figure 8:
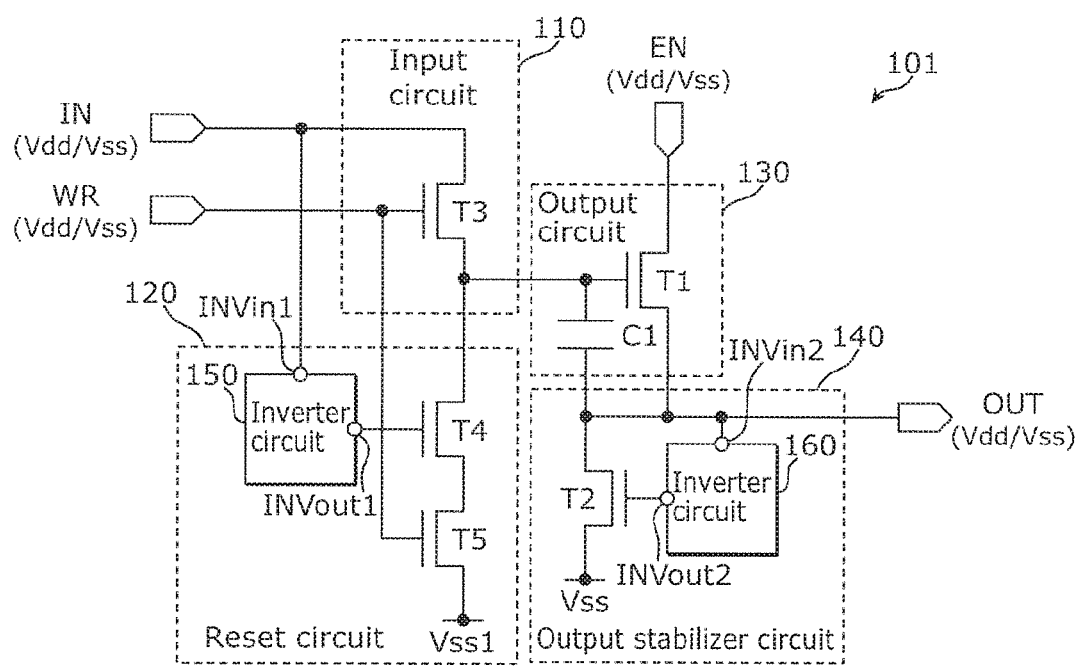
FIG. 8 is a circuit diagram illustrating an example of a configuration of a transfer circuit according to an embodiment.

FIG. 8 is a circuit diagram illustrating an example of a configuration of a transfer circuit according to Embodiment 1. In FIG. 8, the parenthesized reference signs added to the signal names are power supply potentials representing the typical potentials of the signals at the high level and the low level.

As illustrated in FIG. 8, a transfer circuit 101 is, as with the transfer circuit 100, a two-phase drive register circuit, and includes an input circuit 110, a reset circuit 120, an output circuit 130, and an output stabilizer circuit 140.

The output circuit includes a transistor T1 and a capacitor C1. One of the source and the drain of the transistor T1 is connected to a pulse power supply EN, the other is connected to the output terminal OUT of the transfer circuit 101, and the gate of the transistor T1 is connected to one end of the capacitor C1.

The input circuit 110 includes a transistor T3. One of the source and the drain of the transistor T3 is connected to the input terminal IN of the transfer circuit 101 and the other is connected to one end of the capacitor C1.

The reset circuit 120 includes an inverter circuit 150 and transistors T4 and T5. The inverter circuit 150 has an input terminal INVin1 connected to the input terminal IN of the transfer circuit 101 and an output terminal INVout1 connected to the gate of the transistor T4. The transistors T4 and T5 are connected in series between one end of the capacitor C1 and a power supply line Vss1.

The output stabilizer circuit 140 includes an inverter circuit 160 and a transistor T2. The inverter circuit 160 has an input terminal INVin2 connected to the output terminal OUT of the transfer circuit 101 and an output terminal INVout2 connected to the gate of the transistor T2.

Here, the inverter circuit 150 and the inverter circuit 160 are examples of the first inverter circuit and the second inverter circuit, respectively. The transistor T4 is an example of the first transistor, and the transistor T2 is an example of the second transistor. The transistors T1, T3, and T5 are examples of the sixth transistor, the seventh transistor, and the eighth transistor, respectively. All the transistors included in the transfer circuit 101 may be oxide semiconductor transistors, for example. The gate of each transistor is an example of the control signal end, and one and the other of the source and the drain are examples of the first main signal end and the second main signal end. The capacitor C1 is an example of the first capacitor.

Figure 9:
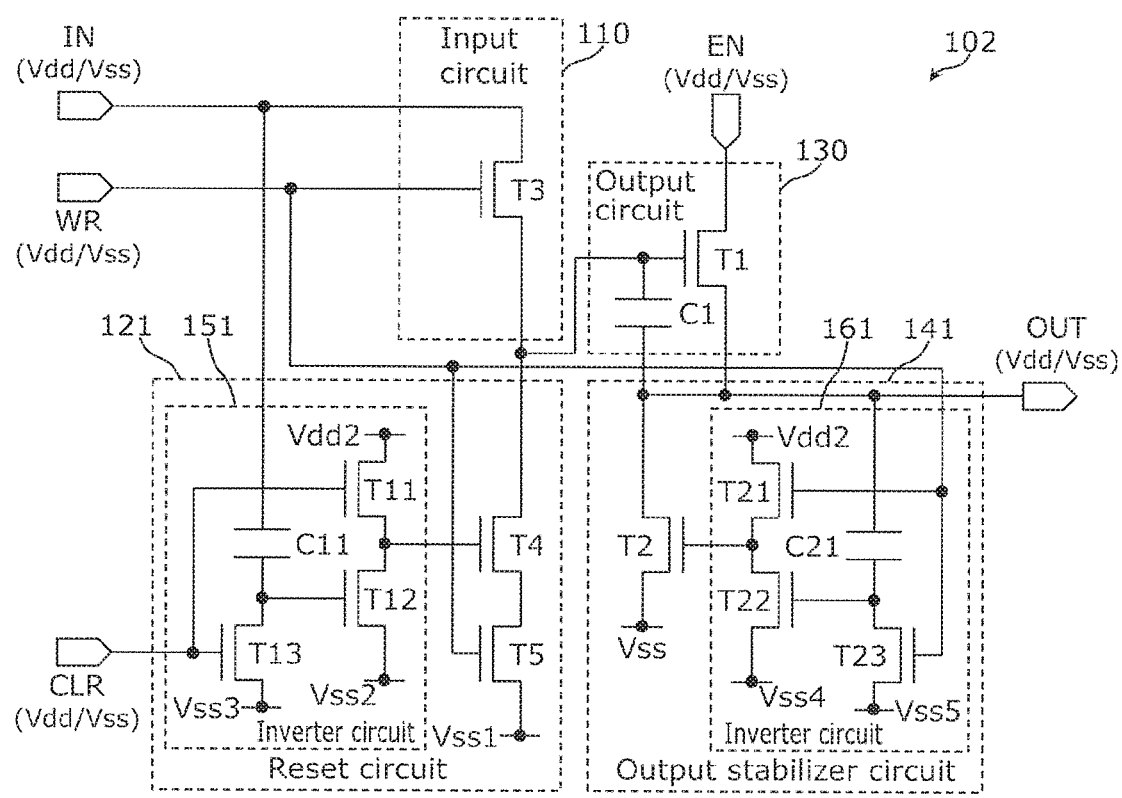
FIG. 9 is a circuit diagram illustrating an example of a specific configuration of the transfer circuit according to the embodiment.

FIG. 9 is a circuit diagram illustrating a specific example of a transfer circuit 102. In the transfer circuit 102, the details of inverter circuits 151 and 161 are shown in a reset circuit 121 and an output stabilization circuit 141, respectively.

The transfer circuit 102 operates in synchronization with a control signal WR, a control signal CLR, and a pulse power supply EN. The control signal WR corresponds to, of the two-phase clock signals, the first-phase clock signal, and the control signal CLR and the pulse power supply EN correspond to the second-phase clock signal.

Hereinafter, a configuration and operations of the inverter circuit will be described first, and then an overall operation of the transfer circuit 102 will be described in detail.

As illustrated in FIG. 9, the inverter circuit 151 and the inverter circuit 161 have the same circuit configuration; each inverter circuit includes three transistors and one capacitor.

Figure 10:
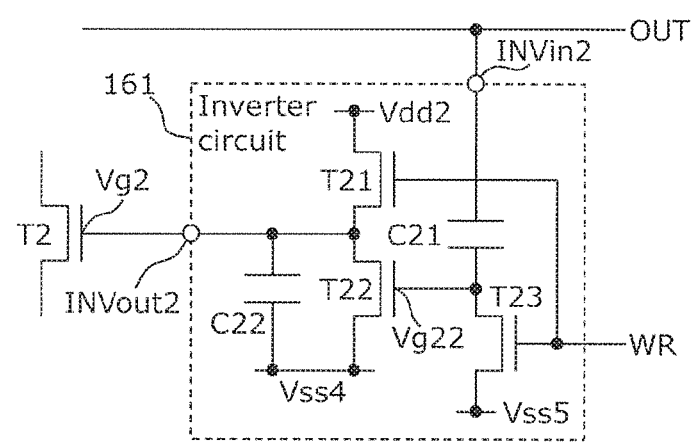
FIG. 10 is a circuit diagram illustrating an example of an inverter circuit according to the embodiment.

FIG. 10 is a circuit diagram illustrating the inverter circuit 161 excerpted. The circuit configurations of the inverter circuits 151 and 161 will be described using the inverter circuit 161 in FIG. 10 as an example.

The inverter circuit 161 includes transistors T21, T22, and T23, and a capacitor C21. Note that a capacitor C22 explicitly represents the parasitic capacitance of an output terminal INVout2 of the inverter circuit 161, and will be referred to in the description of the circuit operation later.

The inverter circuit 161 has an input terminal INVin2 connected to the output terminal OUT of the transfer circuit 102.

The capacitor C21 has one end connected to the input terminal INVin2, and the transistor T23 is connected between the other end of the capacitor C21 and a power supply line Vss5. The transistors T21 and T22 are connected in series between power supply lines Vdd2 and Vss4.

The gate of the transistor T22 is connected to the connection point between the capacitor C21 and the transistor T23. The connection point between the transistor T21 and the transistor T22 is connected to the gate of the transistor T2 as the output terminal INVout2 of the inverter circuit 161.

Here, the transistors T23, T22, and T21 are examples of the third transistor, the fourth transistor, and the fifth transistor, respectively, and the capacitor C21 is an example of the second capacitor. Note that in the inverter circuit 151, which corresponds to the inverter circuit 161 in configuration, the transistors T13, T12, and T11 are examples of the third transistor, the fourth transistor, and the fifth transistor, respectively, and the capacitor C11 is an example of the second capacitor.

The operations of the inverter circuit 161 will be described below.

Figure 11:
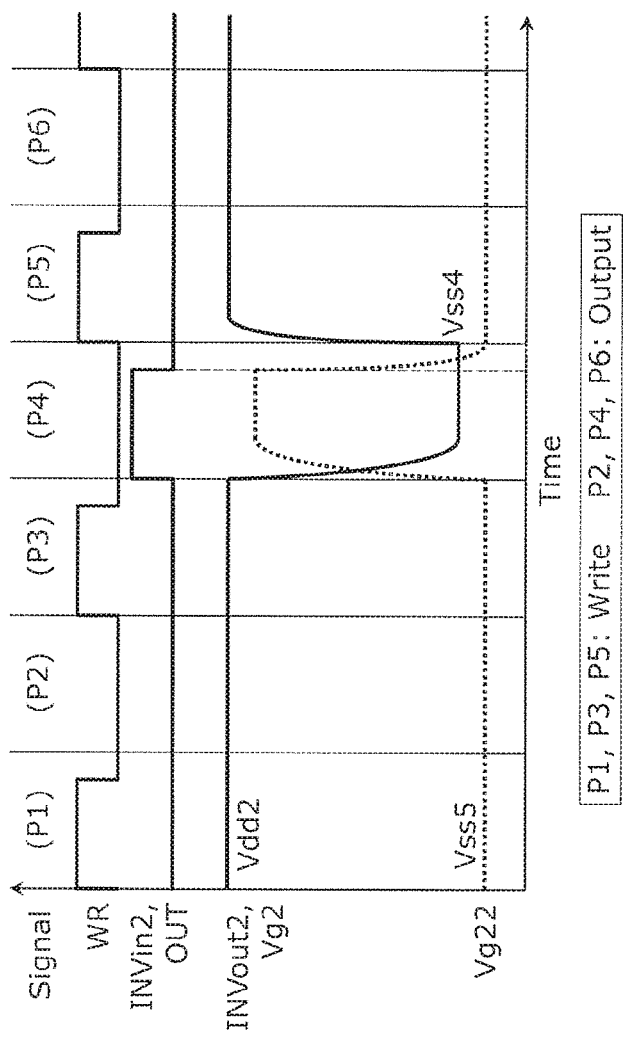
FIG. 11 is a timing chart illustrating an example of operations of the inverter circuit according to the embodiment.

FIG. 11 is a timing chart illustrating an example of operations of the inverter circuit 161.

FIG. 12A to FIG. 12D are circuit diagrams each illustrating an example of an operating state of the inverter circuit 161 in the main part of the timing chart in FIG. 11 (specifically, periods P3 and P4). In FIG. 12A to FIG. 12D, the transistors in the ON state are Indicated by solid lines, and the transistors in the OFF state are indicated by dotted lines. Transmission of a potential is indicated by a dashed arrow.

In the period P3, the control signal WR is at the high level, and the potential of the output terminal OUT of the transfer circuit 102, that is, the potential of the input terminal INVin2 of the inverter circuit 161 is at the low level.

Figure 12A:
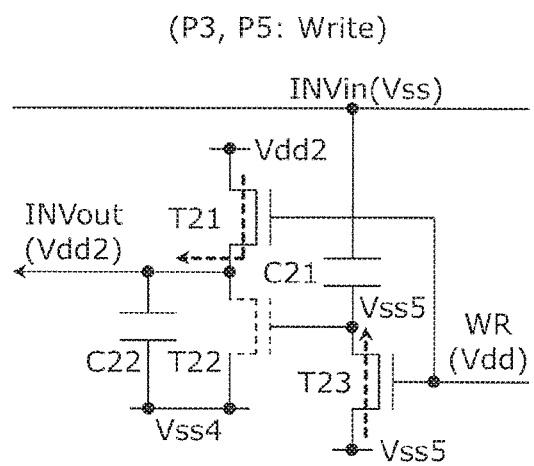
FIG. 12A is a circuit diagram illustrating an example of an operating state of the inverter circuit according to the embodiment.

At this time, the gate potential of the transistor T22 is set to Vss5 by the transistor T23. Here, by setting the power supplies Vss4 and Vss5 such that the gate-source voltage of the transistor T22 becomes smaller than the threshold voltage, the transistor T22 is placed in the OFF state (FIG. 12A).

As a result of the transistor T21 being placed in the ON state, the power supply potential Vdd2 is transmitted to the output terminal INVout2 of the inverter circuit 161. When the power supply potential Vdd2 is lower than or equal to the sum of the high-level potential of the control signal WR and the threshold voltage Vt21 of the transistor T21, the potential of the output terminal INVout2 of the inverter circuit 161 becomes Vdd2. When the power supply potential Vdd2 is higher than or equal to the sum of the high-level potential of the control signal WR and the threshold voltage Vt21 of the transistor T21, the potential of the output terminal INVout2 of the inverter circuit becomes Vdd-Vt21. In either case, the potential of the output terminal INVout2 of the inverter circuit becomes high level. Here, the power supply potential Vdd2 is lower than or equal to the sum of the high-level potential of the control signal WR and the threshold voltage Vt21 of the transistor T21.

Figure 12B:
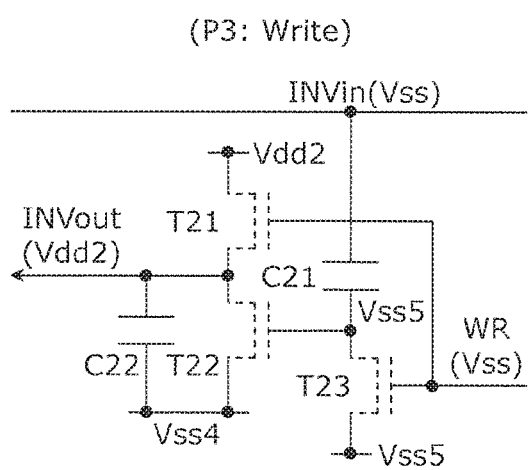
FIG. 12B is a circuit diagram illustrating an example of an operating state of the inverter circuit according to the embodiment.

The control signal WR becomes low level partway in the period P3. At this time, the transistors T21 and T23 are placed in the OFF state, but the potential of each node of the inverter circuit 161 is held by the capacitors C21 and C22 (FIG. 12B).

Figure 12C:
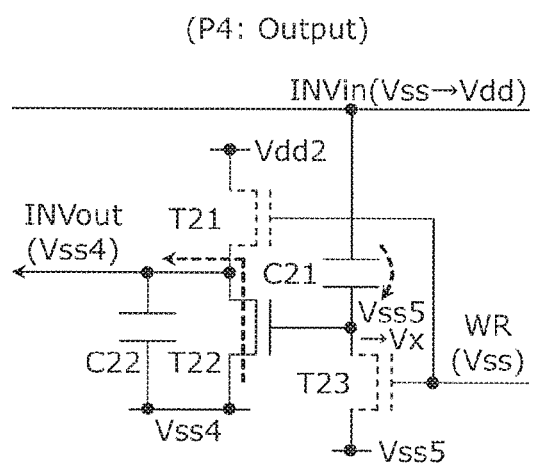
FIG. 12C is a circuit diagram illustrating an example of an operating state of the inverter circuit according to the embodiment.

In the period P4, the potential of the output signal OUT of the transfer circuit 102 changes from the low level to the high level, and this change in potential raises the gate potential of the transistor T22 via the capacitor C21. When the gate-source voltage Vgs of the transistor T22 becomes greater than the threshold voltage Vt22 of the transistor T22, the transistor T22 is placed in the ON state (FIG. 12C). The potential of the output terminal INVout2 of the inverter circuit 161 becomes the power supply potential Vss4.

Figure 12D:
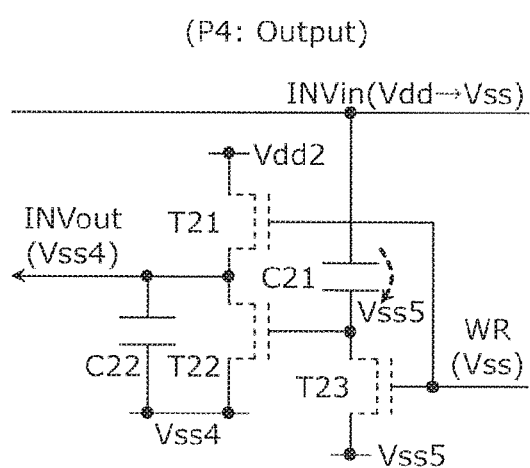
FIG. 12D is a circuit diagram illustrating an example of an operating state of the inverter circuit according to the embodiment.

Partway in the period P4, the potential of the output signal OUT of the transfer circuit 102 changes from the high level to the low level, and this change in potential lowers the gate potential of the transistor T22 via the capacitor C21, whereby the transistor T22 is placed in the OFF state again (FIG. 12D).

In the period P5, the control signal WR changes to the high level, and the transistors T21 and T23 are placed in the ON state. The output terminal INVout2 of the inverter circuit 161 is set to the power supply potential Vdd2 via the transistor T21. The gate of the transistor T22 is set to the power supply potential Vss5 via the transistor T23 (FIG. 12A).

In such a manner as described, with the inverter circuit 161, the output terminal INVout2 of the inverter circuit 161 can be at the low level from when the potential of the output terminal OUT of the transfer circuit 102 changes from the low level to the high level until when the control signal WR changes from the low level to the high level.

Next, operations of the transfer circuit 102 will be described.

Figure 13:
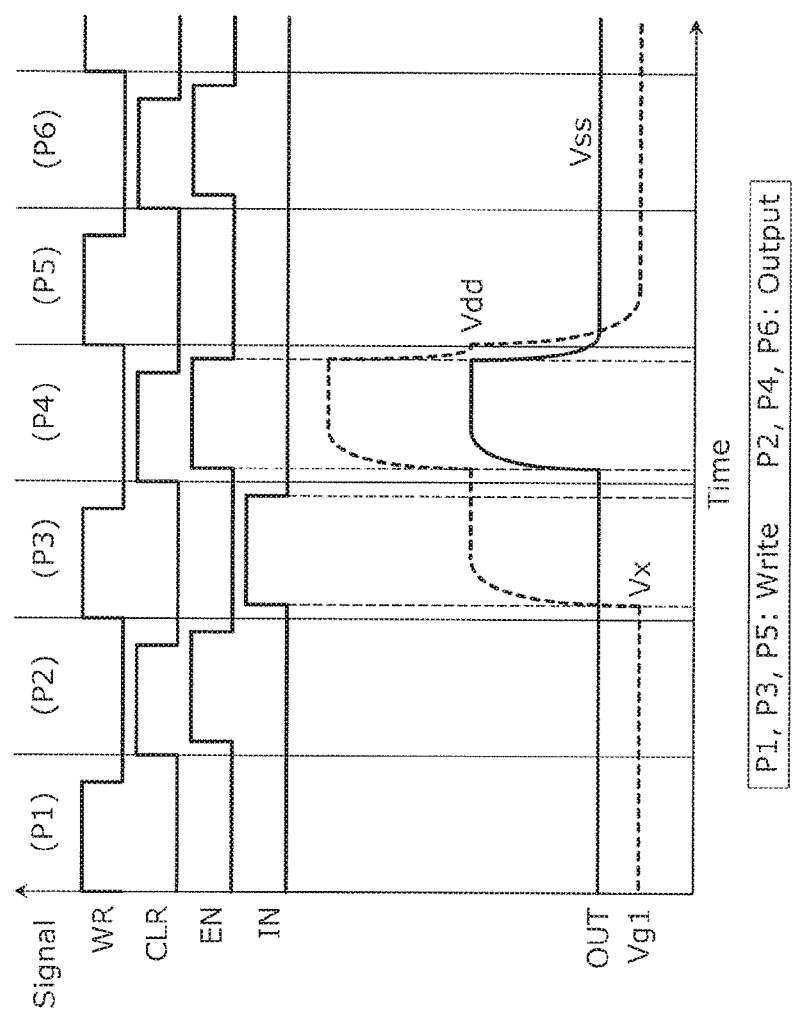
FIG. 13 is a timing chart illustrating an example of operations of the transfer circuit according to the embodiment.

FIG. 13 is a timing chart illustrating an example of operations of the transfer circuit 102. As described above, the control signal WR corresponds to, of the two-phase clock signals, the first-phase clock signal, and the control signal CLR and the pulse power supply EN correspond to the second-phase clock signal.

As illustrated in FIG. 13, the control signal CLR and the pulse power supply EN need not change at exactly the same timing, and may change at different timing, so long as there is no overlap between the active (high-level) periods of the control signal CLR and the pulse power supply EN and the active (high-level) period of the control signal WR.

FIG. 14A to FIG. 14D are circuit diagrams each illustrating an example of an operating state of the transfer circuit 102 in the main part of the timing chart in FIG. 13. In FIG. 14A to FIG. 14D, the transistors in the ON state are indicated by solid lines, and the transistors in the OFF state are indicated by dotted lines. Transmission of a potential is indicated by a dashed arrow.

In the period P1, the control signal WR is at the high level, and the control signal CLR, the pulse power supply EN, and the input signal IN are at the low level. At this time, the output of the inverter circuit 161 becomes high level, and thus the transistor T2 is placed in the ON state and the output terminal OUT of the transfer circuit 102 becomes Vss (low level) (FIG. 14A).

Figure 14A:
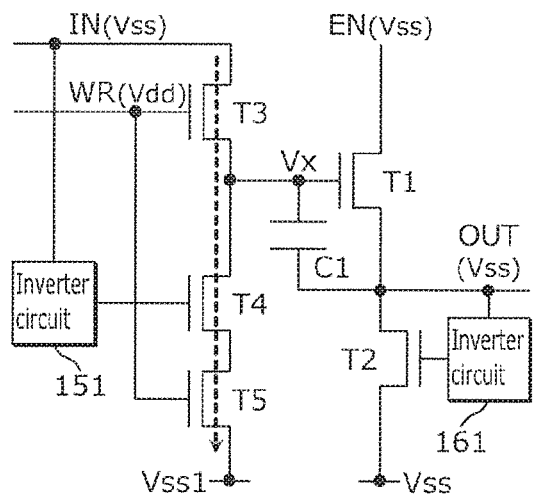
FIG. 14A is a circuit diagram illustrating an example of an operating state of the transfer circuit according to the embodiment.

Since the transistors T3, T4, and T5 are placed in the ON state, a shoot-through current flows and the gate potential of the transistor T1 becomes Vx as illustrated in FIG. 14A. The transistor T1 is placed in the OFF state when the gate-source voltage Vgs of the transistor T1 is smaller than or equal to the threshold voltage Vt1 of the transistor T1.

Figure 14B:
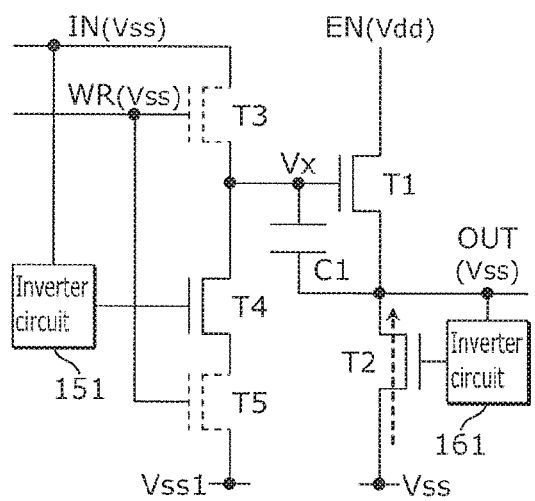
FIG. 14B is a circuit diagram illustrating an example of an operating state of the transfer circuit according to the embodiment.

In the period P2, the control signal WR is at the low level, and the control signal CLR and the pulse power supply EN change from the low level to the high level (FIG. 14B).

At this time, the output signal OUT of the transfer circuit 102 remains at the low level when the transistor T1 is in the OFF state as described above. Even if the gate-source voltage of the transistor T1 is greater than or equal to the threshold voltage Vt1 of the transistor T1, the output of the inverter circuit 161 remains at the high level and a shoot-through current flows (not illustrated) via the transistors T1 and T2 as long as the transistor T22 is not placed in the ON state. As a result, the potential of the output terminal OUT of the transfer circuit 102 does not significantly rise from Vss.

Figure 14C:
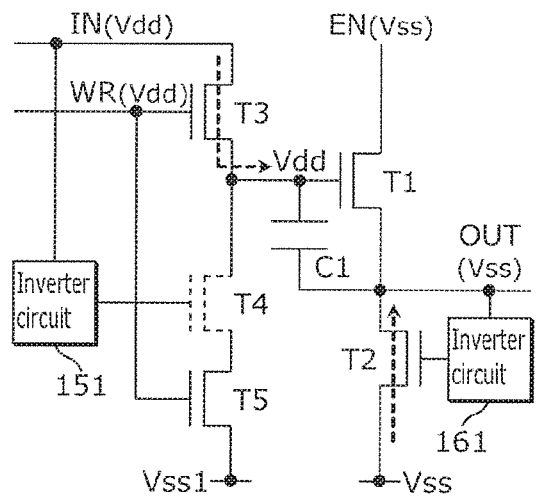
FIG. 14C is a circuit diagram illustrating an example of an operating state of the transfer circuit according to the embodiment.

In the period P3, the control signal CLR and the pulse power supply EN are at the low level, the control signal WR is set at the high level again, and the input signal IN is changed from the low level to the high level. At this time, the output signal of the inverter circuit 151 becomes low level, and thus the gate potential of the transistor T1 becomes high level (for example, the potential Vdd). Note that the output signal of the inverter circuit 161 remains at the high level (FIG. 14C).

Figure 14D:
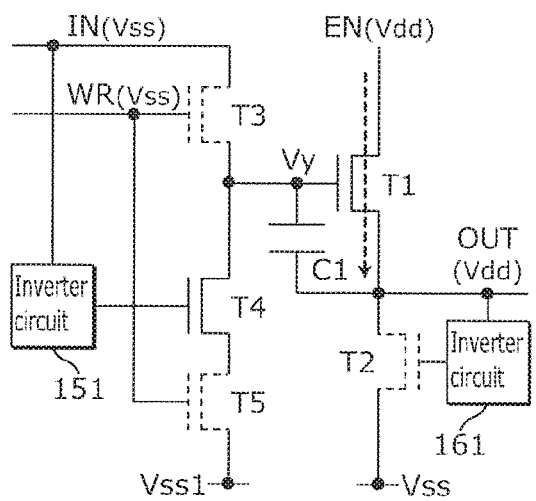
FIG. 14D is a circuit diagram illustrating an example of an operating state of the transfer circuit according to the embodiment.

In the period P4, the control signal WR is at the low level, and the pulse power supply EN is changed from the low level to the high level. As a result, a current flows from the pulse power supply EN, and the gate potential and the source potential of the transistor T1 (the potential of the output terminal OUT of the transfer circuit 102) rise. With this, the output signal of the inverter circuit 161 becomes low level, the transistor T2 is placed in the OFF state, and the output signal OUT of the transfer circuit becomes high level (FIG. 14D). Thereafter, the pulse power supply EN changes from the high level to the low level, and the output signal OUT also changes to the low level.

In the periods P5 and P6, the same operations as in the periods P1 and P2 are repeated.

As described above, with the transfer circuit 102, even when the threshold voltages of the transistors included in the transfer circuit 102 are negative, the transistor T1 can be placed in the OFF state by voltage setting as described earlier, and furthermore, the circuit operation inhibits the potential of the output signal OUT from significantly rising.

This enables reduction in occurrence of erroneous transfer in the shift register including a plurality of transfer circuits 102 connected in series.

Further, since the transfer circuits 102 operate according to the two-phase clock signals, the transfer circuits 102 can be driven with a small number of control signals, thereby enabling reduction of the system scale and cost.

Figure 15A:
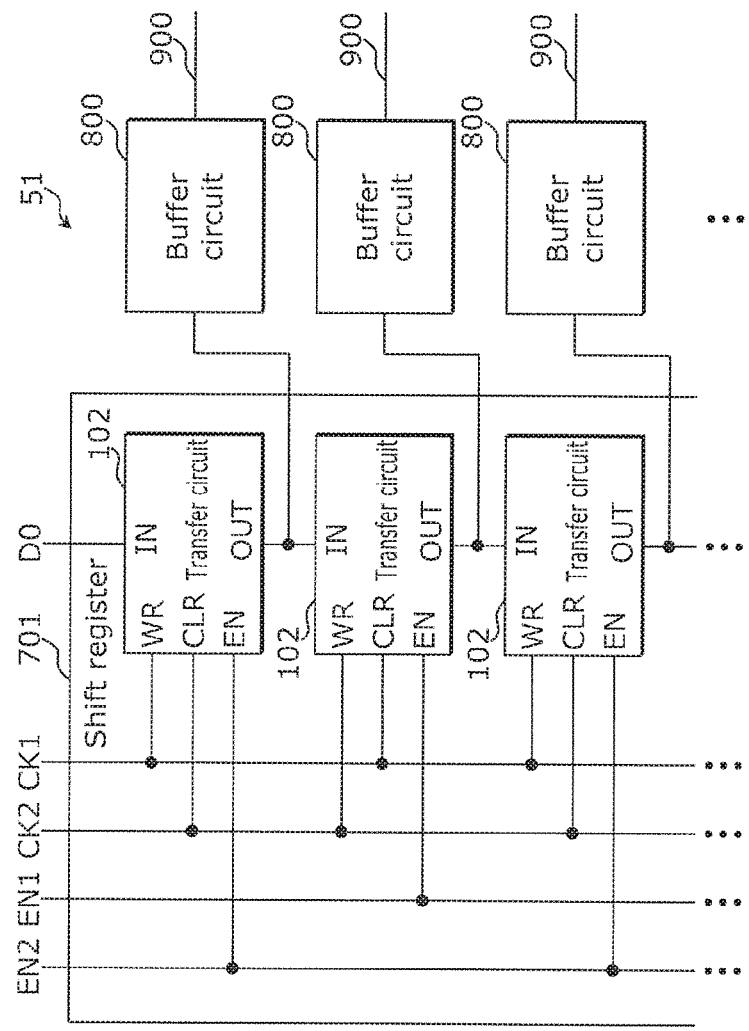
FIG. 15A is a functional block diagram illustrating an example of a configuration of a gate driver according to the embodiment.

FIG. 15A is a functional block diagram illustrating an example of a gate driver 51 including the transfer circuits 102. The gate driver 51 is a general-purpose scanner circuit applicable to both the write scanner 21 and the row power supply scanner 22 in FIG. 1, for example. The gate driver 51 includes a shift register 701 including a plurality of transfer circuits 102 connected in series and a plurality of buffer circuits 800 that drive output signal lines 900 according to the output of the transfer circuits 102. The transfer circuits 102, the buffer circuits 800, and the output signal lines 900 are provided corresponding to the rows of the display device 1.

Figure 15B:
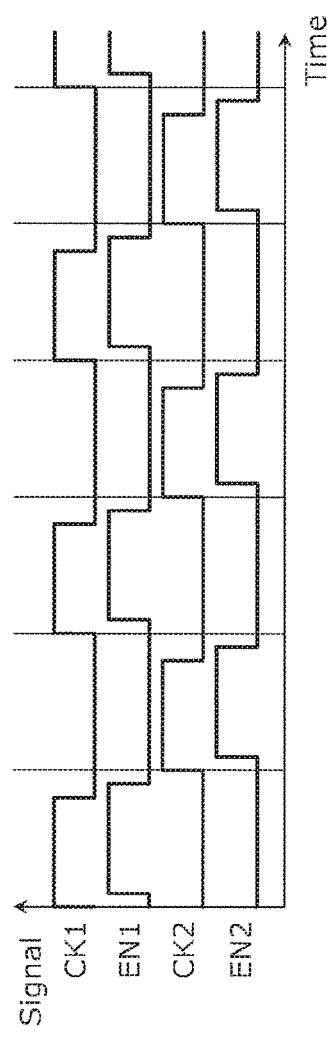
FIG. 15B is a waveform diagram illustrating an example of drive signals for the gate driver according to the embodiment.

FIG. 15B is a waveform diagram illustrating an example of signals used for driving the shift register 701. The shift register 701 is a two-phase drive shift register driven by two-phase clock signals and pulse power supplies whose active (high-level) periods per phase do not overlap each other. In FIG. 15B, a clock signal CK1 and a pulse power supply EN1 correspond to a clock signal and a pulse power supply of the first phase, and a clock signal CK2 and a pulse power supply EN2 correspond to a clock signal and a pulse power supply of the second phase.

The transfer circuits 102 in the odd-numbered rows operate according to the clock signal CK1, the clock signal CK2, and the pulse power supply EN2 as the control signal WR, the control signal CLR, and the pulse power supply EN, respectively. The transfer circuits 102 in the even-numbered rows operate according to the clock signal CK2, the clock signal CK1, and the pulse power supply EN1 as the control signal WR, the control signal CLR, and the pulse power supply EN, respectively.

With the shift register 701 and the gate driver 51 having such configurations as described above, occurrence of erroneous transfer is reduced, thereby giving the shift register and the gate driver excellent operation stability and reliability.

The following describes some variations of the transfer circuit.

Figure 16:
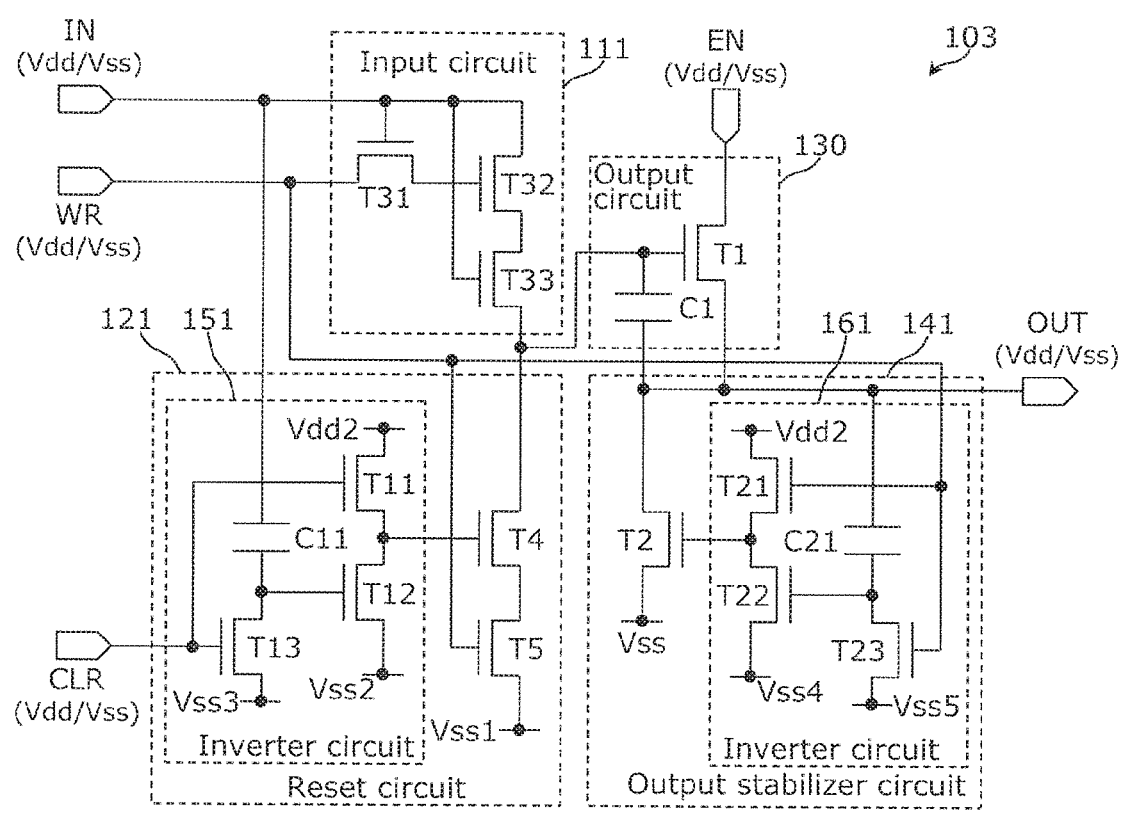
FIG. 16 is a circuit diagram illustrating an example of a configuration of a transfer circuit according to Variation 1 of the embodiment.

FIG. 16 is a circuit diagram illustrating an example of a transfer circuit 103 according to Variation 1. As illustrated in FIG. 16, the difference of the transfer circuit 103 from the transfer circuit 102 in FIG. 9 is an input circuit 111. The input circuit 111 may include three transistors T31, T32, and T33.

Figure 17:
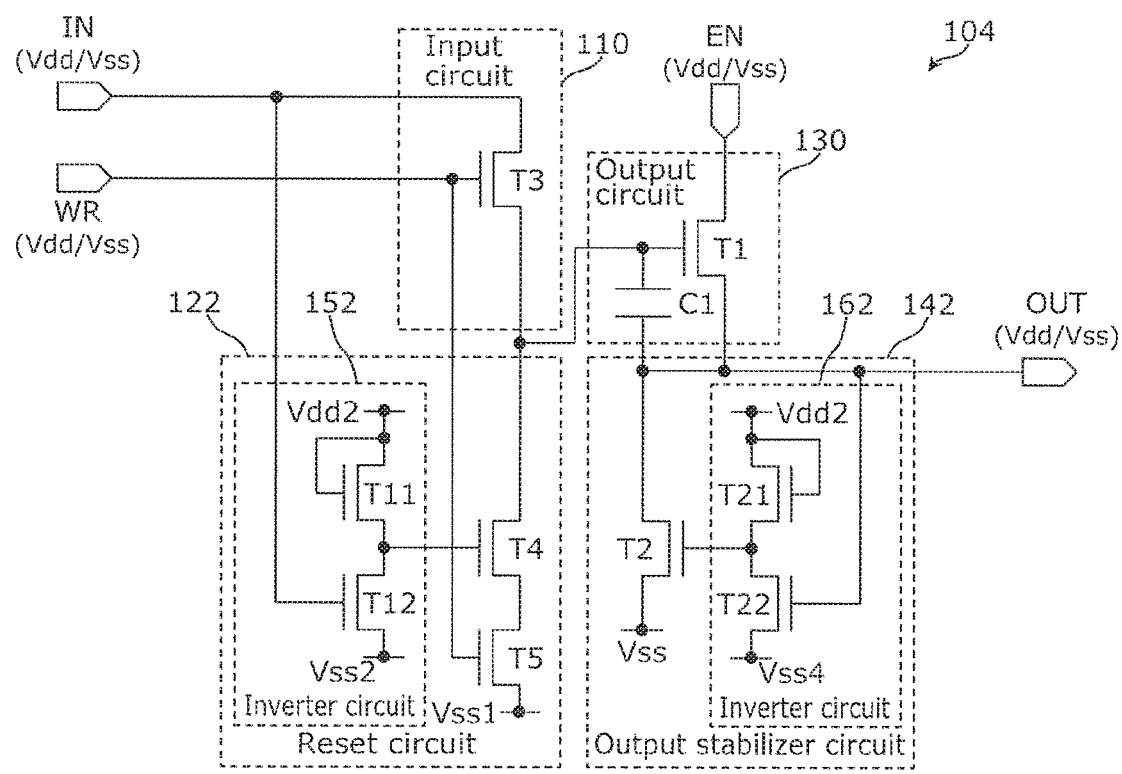
FIG. 17 is a circuit diagram illustrating an example of a configuration of a transfer circuit according to Variation 2 of the embodiment.

FIG. 17 is a circuit diagram illustrating an example of a configuration of a transfer circuit 104 according to Variation 2. As illustrated in FIG. 17, in the transfer circuit 104, a reset circuit 122 and an output stabilization circuit 142 have inverter circuits 152 and 162, respectively. The inverter circuits 152 and 162 may asynchronously invert and output the input signal IN and the output signal OUT without using the control signals WR and CLR.

Figure 18:
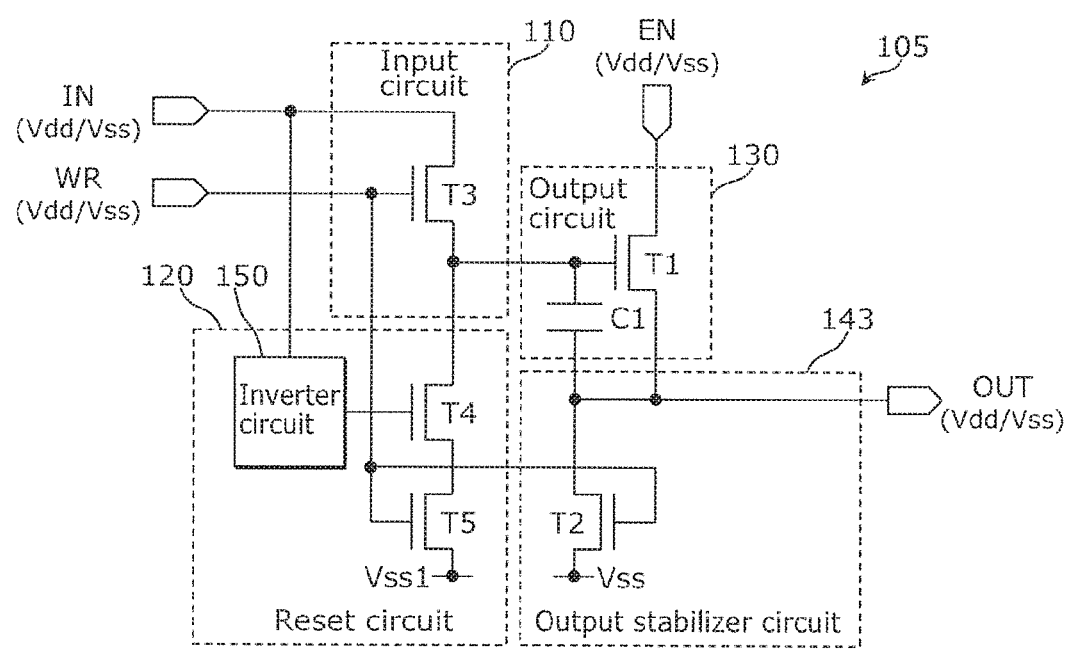
FIG. 18 is a circuit diagram illustrating an example of a configuration of a transfer circuit according to Variation 3 of the embodiment.

FIG. 18 is a circuit diagram illustrating an example of a configuration of a transfer circuit 105 according to Variation 3. As illustrated in FIG. 18, an output stabilizing circuit 143 may omit an inverter circuit, and the control signal WR may be supplied to the gate of the transistor T2.

According to such a configuration, when the input signal IN is at the low level and the control signal WR is at the high level, the gate potential of the transistor T1 can be set to Vx, and the transistor T1 can be placed in the OFF state by voltage setting. As a result, erroneous transfer can be reduced.

Figure 19:
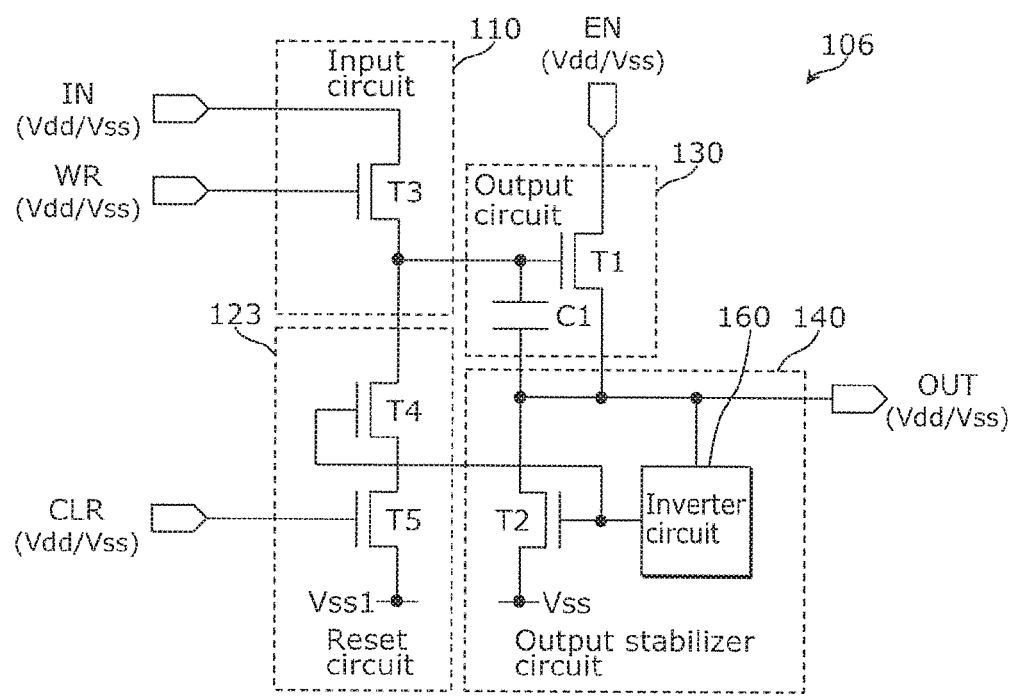
FIG. 19 is a circuit diagram illustrating an example of a configuration of a transfer circuit according to Variation 4 of the embodiment.

FIG. 19 is a circuit diagram illustrating an example of a configuration of a transfer circuit 106 according to Variation 4. As illustrated in FIG. 19, in the transfer circuit 106, a reset circuit 123 omits an inverter circuit, and the output terminal of an inverter circuit 160 in an output stabilizing circuit 140 is connected to the gates of both the transistors T2 and T4. The control signal CLR is supplied to the gate of the transistor T5.

In the transfer circuit 106, too, when the input terminal IN is at the high level, the transistor T5 is placed in the OFF state by the control signal CLR, whereby the reset circuit 123 is placed in the OFF state and the gate potential of the transistor T1 becomes high level.

Figure 20A:
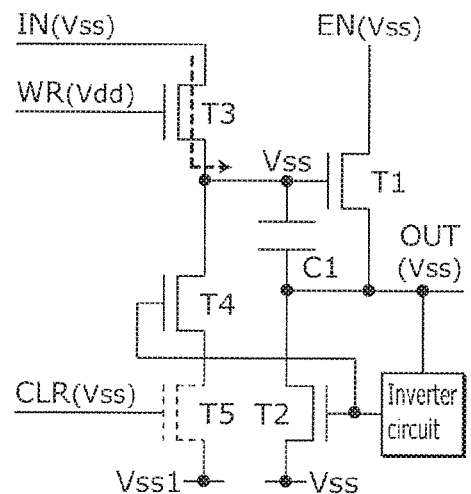
FIG. 20A is a circuit diagram illustrating an example of an operating state of the transfer circuit according to Variation 4 of the embodiment.
Figure 20B:
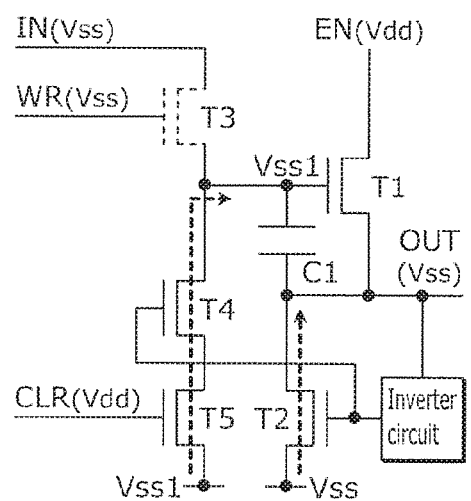
FIG. 20B is a circuit diagram illustrating an example of an operating state of the transfer circuit according to Variation 4 of the embodiment.

As illustrated in FIG. 20A, in the transfer circuit 106, when the input signal IN is at the low level and the control signal WR is at the high level, the potentials of the gate and the source of the transistor T1 both become Vss. Thus, although the transistor T1 is placed in the ON state when the threshold voltage Vt1 of the transistor T1 is negative, the gate potential of the transistor T1 is set to Vss1 as illustrated in FIG. 20B when the pulse power supply EN and the control signal CLR change to the high level, and therefore, the output signal OUT remains at the low level.

Since the transfer circuit 106 allows reduction in the number of inverter circuits, a higher circuit density can be achieved, contributing to higher definition of the display panel. In addition, since the shoot-through current can be reduced, it is also possible to reduce circuit power consumption.

Although a transfer circuit and a shift register including a plurality of transfer circuits connected in series according to the present disclosure have been described above based on exemplary embodiments and variations, the present disclosure is not limited to the embodiments and variations described above. The present disclosure also encompasses a display device and a driving method thereof obtained by making various modifications conceivable to a person skilled in the art and freely combining the structural elements and operations in the embodiments within the scope of the essence of the present disclosure.

For example, the present disclosure may encompass a gate driver including: a shift register according to the present disclosure; and a buffer circuit that processes an output signal from each stage of the shift register.

Furthermore, for example, the present disclosure may encompass a display panel including a gate driver according to the present disclosure and a flexible substrate including a gate driver according to the present disclosure.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure is, as a transfer circuit and a shift register including a plurality of transfer circuits connected in series, applicable to a gate driver in a display device, for example.

The invention claimed is:

1. A transfer circuit that includes an input circuit, a reset circuit, an output circuit, and an output stabilizer circuit, and obtains an input signal at an input terminal, holds the input signal, and outputs the input signal from an output terminal as an output signal in synchronization with a clock signal, the transfer circuit comprising:
   a first capacitor that holds the input signal;
   a first inverter circuit that has an input terminal connected to the input terminal of the transfer circuit, and outputs an inverted signal from an output terminal, the inverted signal having an inverted polarity of the input signal; and
   a fourth transistor having a control signal end connected to the output terminal of the first inverter circuit, the fourth transistor switching continuity and discontinuity of a signal path between a first end of the first capacitor that holds the input signal and a first power supply,
   wherein the first inverter circuit is included in the reset circuit.

2. The transfer circuit according to claim 1, further comprising:

a second inverter circuit included in the output stabilizer circuit and having an input terminal connected to the output terminal of the transfer circuit, the second inverter circuit outputting, from an output terminal, an inverted signal having an inverted polarity of the output signal of the transfer circuit, the control signal end of the first transistor is connected to the output terminal of the first inverter circuit, and a second transistor included in the output stabilizer circuit and having a control signal end connected to the output terminal of the second inverter circuit, the second transistor switching continuity and discontinuity of a signal path between a second end of the first capacitor that holds the input signal and a second power supply.

3. The transfer circuit according to claim 2, wherein
the output circuit includes the first capacitor and the first transistor, the input circuit includes a third transistor, the third transistor switching continuity and discontinuity of a signal path between the input terminal of the transfer circuit and the control signal end of the first transistor, and the reset circuit further includes a fifth transistor connected with the fourth transistor in series on the signal path between the first end of the first capacitor and the first power supply.

4. The transfer circuit according to claim 3, further comprising:
a control terminal, for receiving a control signal, connected to a control signal end of the third transistor and a control signal end of the fifth transistor.

5. The transfer circuit according to claim 1, wherein
the first inverter circuit includes:
a second capacitor connected to the input terminal of the inverter circuit;
a thirteenth transistor connected between a second power supply and the second capacitor;
an eleventh transistor connected between the output terminal of the inverter circuit and a third power supply; and
a twelfth transistor connected between the output terminal of the inverter circuit and a fourth power supply.

6. The transfer circuit according to claim 5, wherein
the first inverter circuit outputs the inverted signal in synchronization with the clock signal of the transfer circuit.

7. The transfer circuit according to claim 1, wherein
each transistor included in the transfer circuit is an oxide semiconductor transistor.

8. A shift register, comprising:
a plurality of transfer circuits connected in multiple stages, wherein
each of the plurality of transfer circuits in the multiple stages is the transfer circuit according to claim 1.

9. A gate driver, comprising:
the shift register according to claim 8; and
a buffer circuit that processes an output signal from each of the multiple stages of the shift register.

10. A display panel comprising the gate driver according to claim 9.

11. A flexible substrate comprising the gate driver according to claim 9.

12. The transfer circuit according to claim 1, further comprising:
a first transistor having a control signal end connected to the first end of the first capacitor, the first transistor switching continuity and discontinuity of a signal path between a pulse power supply and the output terminal of the transfer circuit, the first transistor being a depletion-type transistor having a negative threshold voltage.

13. A transfer circuit that includes an input circuit, a reset circuit, an output circuit, and an output stabilizer circuit, and obtains an input signal at an input terminal, holds the input signal, and outputs the input signal from an output terminal as an output signal in synchronization with a clock signal, the transfer circuit comprising:
a first capacitor that holds the input signal;
a second inverter circuit that has an input terminal connected to the output terminal of the transfer circuit, and outputs an inverted signal from an output terminal, the inverted signal having an inverted polarity of the output signal; and
a second transistor having a control signal end connected to the output terminal of the second inverter circuit, the second transistor switching continuity and discontinuity of a signal path between a second end of the first capacitor that holds the input signal and a first power supply,
wherein the second inverter circuit is included in the output stabilizer circuit.

14. The transfer circuit according to claim 13, wherein
the output circuit includes the first capacitor and the first transistor, the input circuit includes a third transistor, the third transistor switching continuity and discontinuity of a signal path between the input terminal of the transfer circuit and the control signal end of the first transistor, and the reset circuit further includes a fifth transistor connected with a fourth transistor in series on a signal path between the first end of the first capacitor and a second power supply.

15. The transfer circuit according to claim 14, wherein
a control signal applied to a control signal end of the third transistor and a control signal applied to a gate of the fifth transistor do not become high level simultaneously.

16. The transfer circuit according to claim 13, further comprising:
a first transistor having a control signal end connected to a first end of the first capacitor, the first transistor switching continuity and discontinuity of a signal path between a pulse power supply and the output terminal of the transfer circuit, the first transistor being a depletion-type transistor having a negative threshold voltage.

17. The transfer circuit according to claim 13, wherein
the second inverter circuit includes:
a second capacitor connected to the input terminal of the inverter circuit;
a twenty-third transistor connected between a second power supply and the second capacitor;
a twenty-first transistor connected between the output terminal of the inverter circuit and a third power supply; and
a twenty-second transistor connected between the output terminal of the inverter circuit and a fourth power supply.

18. The transfer circuit according to claim 17, wherein
the second inverter circuit outputs the inverted signal in synchronization with the clock signal of the transfer circuit.

19. The transfer circuit according to claim 13, wherein each transistor included in the transfer circuit is an oxide semiconductor transistor.

20. A shift register, comprising:
a plurality of transfer circuits connected in multiple stages, wherein
each of the plurality of transfer circuits in the multiple stages is the transfer circuit according to claim 13.

* * * * *